(12) United States Patent
Kunz et al.

(10) Patent No.: US 6,542,358 B1
(45) Date of Patent: Apr. 1, 2003

(54) RETRACTABLE PLATFORM WITH WIRELESS ELECTRICAL INTERFACE

(75) Inventors: Ryan A. Kunz, Roy, UT (US); Tim Urry Price, Salt Lake City, UT (US); John Evans, Riverton, UT (US); Steven Lo Forte, Midvale, UT (US)

(73) Assignee: 3Com Corporation, Santa Clara, CA (US)

( * ) Notice: Subject to any disclaimer, the term of this patent is extended or adjusted under 35 U.S.C. 154(b) by 138 days.

(21) Appl. No.: 09/703,203

(22) Filed: Oct. 31, 2000

(51) Int. Cl.[7] .............................. G06F 1/16; H01R 17/18
(52) U.S. Cl. ...................... 361/686; 361/737; 361/752; 439/131
(58) Field of Search ................................ 361/686, 737, 361/736, 752, 753; 439/74, 131, 638, 945, 946

(56) References Cited

U.S. PATENT DOCUMENTS

| | | | |
|---|---|---|---|
| 2,916,720 A | 12/1959 | Steans ........................ 339/91 |
| 4,186,988 A | 2/1980 | Kobler ................ 339/176 MP |
| 4,241,974 A | 12/1980 | Hardesty ................ 339/154 A |
| 4,303,296 A | 12/1981 | Spaulding .............. 339/122 R |
| 4,352,492 A | 10/1982 | Smith ...................... 273/1 GC |
| 4,407,559 A | 10/1983 | Meyer .................... 339/126 R |
| 4,428,636 A | 1/1984 | Kam et al. ................. 339/97 P |
| 4,710,136 A | 12/1987 | Suzuki ........................ 439/374 |
| 4,778,410 A | 10/1988 | Tanaka ....................... 439/676 |
| 4,915,648 A | 4/1990 | Takase et al. ............... 439/490 |
| 5,035,641 A | 7/1991 | Van-Santbrink et al. .... 439/329 |
| 5,051,099 A | 9/1991 | Pickles et al. .............. 439/108 |
| 5,139,439 A | 8/1992 | Shie ............................ 439/359 |
| 5,183,404 A | 2/1993 | Aldous et al. ................ 439/55 |
| 5,184,282 A | 2/1993 | Kaneda et al. .............. 361/395 |
| 5,336,099 A | 8/1994 | Aldous et al. .............. 439/131 |
| 5,338,210 A | 8/1994 | Beckham et al. ........... 439/131 |
| 5,391,094 A | 2/1995 | Kakinoki et al. ........... 439/638 |
| 5,411,405 A | 5/1995 | McDaniels et al. ......... 439/131 |
| 5,481,616 A | 1/1996 | Freadman ..................... 381/90 |
| 5,499,923 A | 3/1996 | Archibald et al. ............. 439/26 |
| 5,505,633 A | 4/1996 | Broadbent .................. 439/329 |
| 5,509,811 A | 4/1996 | Homic ........................ 439/55 |

(List continued on next page.)

FOREIGN PATENT DOCUMENTS

| | | |
|---|---|---|
| EP | 0 355 413 | 7/1989 |
| JP | 58-34370 | 5/1983 |
| JP | 61-256850 | 11/1986 |
| WO | WO 95/13633 | 5/1995 |

OTHER PUBLICATIONS

IBM Technical Disclosure Bulletin, "Electrical Connector For Flat Flexible Cable," vol. 25, No. 1, Jun. 1982.

*Primary Examiner*—Darren Schuberg
*Assistant Examiner*—Lisa Lea-Edmonds
(74) *Attorney, Agent, or Firm*—Workman, Nydegger & Seeley (57) ABSTRACT

A retractable platform allows communication to be established with an electronic device, such as a computer expansion card. The retractable platform is preferably slidably attached to the electronic device and retractable platform includes a wireless interface that allows the communication between the platform and the electronic device to be established. The wireless interface may use an optical coupling, inductive coupling, capacitive coupling or other suitable wireless or non-mechanical interface to allow communication between the retractable platform and the electronic device. Advantageously, the retractable platform can be removed and replaced, which virtually eliminates breakage, and it allows the platform to be easily repaired, replaced, upgraded, and the like. The retractable platform can also include electronic circuitry and other suitable components that process or condition the incoming and outgoing signal.

26 Claims, 4 Drawing Sheets

U.S. PATENT DOCUMENTS

| | | | |
|---|---|---|---|
| 5,538,442 A | 7/1996 | Okada | 439/676 |
| 5,547,401 A | 8/1996 | Aldous et al. | 439/676 |
| 5,561,727 A | 10/1996 | Akita et al. | 385/88 |
| 5,562,504 A | 10/1996 | Moshayedi | 439/638 |
| 5,608,607 A | 3/1997 | Dittmer | 361/686 |
| 5,634,802 A | 6/1997 | Kerklaan | 439/131 |
| 5,660,568 A | 8/1997 | Moshayedi | 439/654 |
| 5,667,390 A | 9/1997 | Keng | 439/76.1 |
| 5,667,395 A | 9/1997 | Okada et al. | 439/131 |
| 5,679,013 A | 10/1997 | Matsunaga et al. | 439/144 |
| 5,727,972 A | 3/1998 | Aldous et al. | 439/655 |
| 5,773,332 A | 6/1998 | Glad | 439/344 |
| 5,797,771 A | 8/1998 | Garside | 439/610 |
| 5,816,832 A | 10/1998 | Aldous et al. | 439/131 |
| 5,892,975 A * | 4/1999 | Barnes | 395/838 |
| 6,131,136 A * | 10/2000 | Liebenow et al. | 710/131 |
| 6,164,989 A * | 12/2000 | Glad et al. | 439/131 |
| 6,217,351 B1 * | 4/2001 | Fing et al. | 439/131 |
| 6,295,207 B1 * | 9/2001 | Jones | 361/737 |
| 6,375,479 B1 * | 2/2002 | Johnson et al. | 439/131 |

* cited by examiner

RETRACTABLE PLATFORM WITH WIRELESS ELECTRICAL INTERFACE

BACKGROUND OF THE INVENTION

1. Field of the Invention

The present invention generally relates to a retractable platform that is connectable to an electronic device. More particularly, the present invention relates to a retractable platform that includes a wireless or non-mechanical electrical interface that allows electrical communication to be established with an electronic device.

2. Description of Related Art

The demand for electronic devices, such as personal digital assistants (PDAs), laptop computers, palm computers, mobile telephones and digital music players, continues to expand due to a number of factors. For example, these electronic devices are often in demand because they are portable, affordable and are usable in a wide variety of situations. For instance, a laptop computer is generally portable and it can be connected to a network or communication system from a wide variety of places to send and/or receive information and data. In particular, a conventional laptop computer can be configured to be connected to a local area network (LAN), wide area network (WAN), wireless communication network, telephone network or the Internet from practically any location. Thus, conventional laptop computers allow users to conduct business or other activities at remote or mobile locations, often with performance comparable to desktop workstations. Also, the prices of electronic devices such as laptop computers continue to decline, which makes these devices more readily available to a wide variety of users.

Conventional laptop computers often include one or more slots or sockets that are configured to receive expansion cards. These expansion cards can significantly increase the capabilities of the computer by providing added features and/or capabilities. For instance, known expansion cards are often configured to function as memory cards, communication cards, network interface cards, sound cards, modems, or other devices supplying add-on functionality. Significantly, these expansion cards allow the user to customize the features and capabilities of the computer as desired by the user. Advantageously, these expansion cards are often configured according to guidelines or standards that are known in the industry to promote compatibility and interchangeability. For example, many expansion cards are constructed according to the Personal Computer Memory Card International Association (PCMCIA) guidelines or standards. PCMCIA develops and promulgates standards for the physical design, dimensions, and electrical interface of expansion devices such as expansion cards. Expansion cards that comply with the PCMCIA standards are common referred to as "PC cards." For example, the PCMCIA guidelines set forth specific standards for Type I PC cards, Type II PC cards and Type III PC cards. Each of these PC card types has a length of 85.6 mm and a width of 54.0 mm, but the height varies according to the type of card. For example, a Type I PC cards has a height up to 3.3 mm, a type II PC card has a height up to 5.0 mm, and a Type III PC card has a height up to 10.5 mm.

These known PC cards can combine several of these features on a single card to provide added functionality, and these types of cards are commonly referred to as "combination cards" or "combo cards." For example, a combination card may combine modem and network interface functionality so that a user can use the same card to connect to a LAN, WAN or the Internet. These combination cards may allow the user to perform these additional features or capabilities simultaneously or independently.

PC cards have become very popular because of their relatively small size, interchangeability, and capability. The industry has also developed a new generation of expansion devices with an even smaller physical size or "form factor" than that of PC cards. The new expansion devices, or cards, are commonly referred to as "compact flash" or "miniature flash" cards. A typical compact flash card has a length of 36 mm and a width of 43 mm, which requires about 1550 mm$^2$ of space. In contrast, a PC card with a length of 86 mm and a width of 54 mm requires about 4644 mm$^2$ of space, which is almost three times as much space as the compact flash card. Some examples of the devices developed for the new compact flash cards include modems, local area network cards, and memory cards that have a storage capacity of 40MB, or more.

In order to connect these expansion cards to communication systems and networks, a connector interface is provided. Conventional connector interfaces are generally rigid, protrude outwardly from the body of the expansion card, and protrude outwardly from the body of the electronic device. These protruding connector interfaces are often large, unwieldy, aesthetically unpleasing, and they make the electronic device difficult to move and transport. In addition, these connector interfaces are often bent, broken, knocked out of alignment or otherwise damaged because they can easily catch or strike foreign objects such as people, walls, doors, etc. In order to decrease the risk of damage to the connector interface, large support structures are often used to secure the connector interface to the housing of the expansion card. This large support structure requires a considerable amount of valuable space inside the body of the expansion card. Even with this large support structure, the connector interface is often damaged when it is accidentally bumped or moved. The repair and replacement of conventional connector interfaces and the associated support structure is often difficult and costly because the entire expansion card must often be replaced.

In order to alleviate these problems, the protruding connector interface should be removed before the electronic device is moved or transported. Additionally, the protruding connector interface should be removed before the electronic device is inserted into its carrying case. Disadvantageously, this requires additional time and resources to remove and reattach the connector interface each time the electronic device is moved or inserted into its carrying case. Additionally, the removable connector interface is often misplaced, lost or damaged when it is detached from the electronic device. Further, because the user often does not want to take the time and effort to remove the connector interface, the electronic device is often moved with the connector interface still attached to the electronic device and this frequently results in the connector interface being damaged or broken.

Another known connector interface uses a retraction system in which a retractable connector is slidably attached to an expansion card. The retractable connector is slidable between an extended position when it is desired to attach the expansion card to a communication system and a retracted position when the connector is stored within the expansion card. Thus, in the extended position, the retractable connector permits the expansion card to be electrically connected to a communication system or network. The retractable connector, however, cannot be connected to the communication system or network in the retracted position.

In greater detail, the known retractable connector uses a mechanical interface to permit electrical communication between the connector and the expansion card. For example, the retractable connector may use a mechanical interface such as a flexible circuit to electrically connect the connector to the expansion card. In particular, one end of the flexible circuit is attached to the connector and the other end is connected to the expansion card. The flexible circuit is typically connected to the retractable connector and the expansion card by zero insertion force (ZIF) connectors or soldering. Alternatively, the mechanical interface may include wire or pins that are physically connected to allow electrical communication between the retractable connector and the expansion card. This mechanical interface that allows electrical communication between the retractable connector and the expansion card is inherently subjected to stress, fatigue and wear caused by the movement of the slidable connector relative to the expansion card. Thus, the mechanical interface must be strong and sturdy to prevent these stresses and forces from interrupting or disturbing the electrical communication between the retractable connector and the expansion card. Additionally, it can be difficult to completely electrically isolate the retractable connector from the expansion card because the mechanical interface may allow extraneous or undesirable electrical communication between the retractable connector and the expansion card. Accordingly, if the mechanical interface is not well designed, it may be subject to breakage, wear, decreased performance, and intermittent or undesirable electrical communication.

SUMMARY OF THE INVENTION

A need therefore exists for an interface that allows electrical communication between a retractable platform and an electronic device such as a communication card or PC card.

One aspect of the present invention is a retractable platform that is removably connected to an electronic device such as a communication card. Preferably, the retractable platform is a modular component that is readily detachable from the communication card. Advantageously, this virtually eliminates breakage and it allows for easy repair and replacement of the retractable platform. In addition, the retractable platform is readily interchangeable and upgradable because of its modular design. This allows, for example, different types, sizes and kinds of retractable platforms to be utilized. Further, the retractable platform can be customized to provide the desired functions and/or capabilities, and it is readily connectable to one or more different types of electronic devices and/or communication cards.

Another aspect of the retractable platform is electronic circuitry and/or suitable electronic components located on or disposed within the retractable platform. For example, direct access arrangement (DAA) circuitry, which is used in modems, fax machines, PDAs, cellular telephones, etc., for interfacing with telephone systems may be disposed within the retractable platform. The electronic circuitry may also allow the retractable platform to be compatible or interchangeable with a variety of different electronic devices. Further, the electronic circuitry could be used to protect the electronic device from damage. For example, if the electronic device is a communication card, the circuitry could prevent damage associated with improperly coupling the retractable platform to a digital or PBX communication line. The retractable platform may also include circuitry that processes and/or conditions the incoming/outgoing line signals. Significantly, because the retractable platform is readily removable and replaceable from the communication card or electronic device, the circuitry and/or electronic components can be easily upgraded, replaced, repaired, interchanged, etc.

Still another aspect of the retractable platform is the electronic device and retractable platform do not require any physical or mechanical interface or connection to provide electrical communication between the retractable platform and communication card. That is, the retractable platform and the communication card are not electrically connected by the physical engagement or contact of wires or pins. In contrast, the retractable platform and communication card are electrically connected by a non-mechanical or wireless interface such as infrared (IR), inductive or capacitive coupling. Because there is no mechanical interface or connection that provides electrical communication between the retractable platform and the communication card, the retractable platform is readily removable.

Yet another aspect is the retractable platform and communication card are electrically isolated except for the wireless or non-mechanical interface. Advantageously, this wireless interface reduces the risk of electrical problems such as extraneous electrical connections, signals, interferences, short-circuiting, etc. Further, the wireless or non-mechanical interface may be configured such that electrical communication is only possible when the retractable platform is in a desired position or location. Preferably, the retractable platform is configured such that electrical communication with the communication card is only possible when the platform is in the extended position, and electrical communication is not possible when the platform is in the retracted position.

Another aspect of the retractable platform is the wireless or non-mechanical interface between the retractable platform and the electronic device allows the platform and corresponding device to have various desired configurations and orientations. For example, the wireless interface allows the retractable platform to be located at various angles and locations relative to the electronic device. The wireless connection may also have a smaller size and require less space within the electronic device, which saves valuable space in comparison to conventional retractable connectors. Advantageously, the smaller size of the wireless interface also provides more design options and configurations for the retractable platform and electronic device.

Significantly, the retractable platform is easy to manufacture, repair and replace because of its modular design. In particular, the retractable platform reduces manufacturing time and complexity because its modular design allows the platform to be simply connected and disconnected from the electronic device. The modular design also allows the retractable platform to be easily designed and produced. Further, the retractable platform is compatible with a wide variety of electrical or electronic devices.

A further aspect of the retractable platform is a compression spring that is used to assist in moving the retractable platform into an extended position and storing the platform in the retracted position. The compression spring is preferably located along one side of the retractable connector and the force provided by the compression spring is directed along one side of the retractable connector.

Another aspect of the retractable platform is it can be attached to any suitable electronic device, such as an expansion or communication card used. The communication card desirably complies with known standards such as the PCMCIA standards. Preferably, the retractable platform includes an interface that allows the electronic device, such as the expansion or communication card, to communicate with a communication network or system. More preferably, the retractable platform allows electrical communication between the communication system or network and the communication card via a wireless or non-mechanical interface.

Additional aspects, features and advantages of the invention will become apparent from the detailed description of preferred embodiments that follows.

BRIEF DESCRIPTION OF THE DRAWINGS

The appended drawings contain figures of preferred embodiments of the retractable platform with a wireless interface. The above-mentioned aspects, features and advantages, as well as others, will be described in conjunction with the preferred embodiments. It will be understood, however, that these drawing are only intended to illustrate preferred embodiments of the invention and not limit its scope. The invention will now be described and explained with additional specificity and detail through the use of the accompanying drawings in which.

DETAILED DESCRIPTION OF THE PREFERRED EMBODIMENTS

The present invention involves a retractable platform that is coupled to an electronic device by a wireless or non-mechanical interface. The retractable platform is preferably connected to an expansion or communication card that allows a computer to be connected to a network or communication system. The principles of the present invention, however, are not limited to expansion cards or connectors that facilitate communication with networks or communication systems. It will be understood that, in light of the present disclosure, the retractable platform disclosed herein can be successfully used in connection with other types of electronic devices. Additionally, while the retractable platform is primarily discussed in connection with Personal Computer Memory Card International Association (PCMCIA) compliant communication cards, one skilled in the art will appreciate that the retractable platform can be used with any suitable type of communication card.

In addition, to assist in the description of the retractable platform with a wireless interface, words such as front, rear, right and left are used to describe the accompanying figures. It will be appreciated, however, that the present invention can be located in a variety of desired positions—including various angles, sideways and even upside down. A detailed description of the retractable platform now follows.

Figure 1:
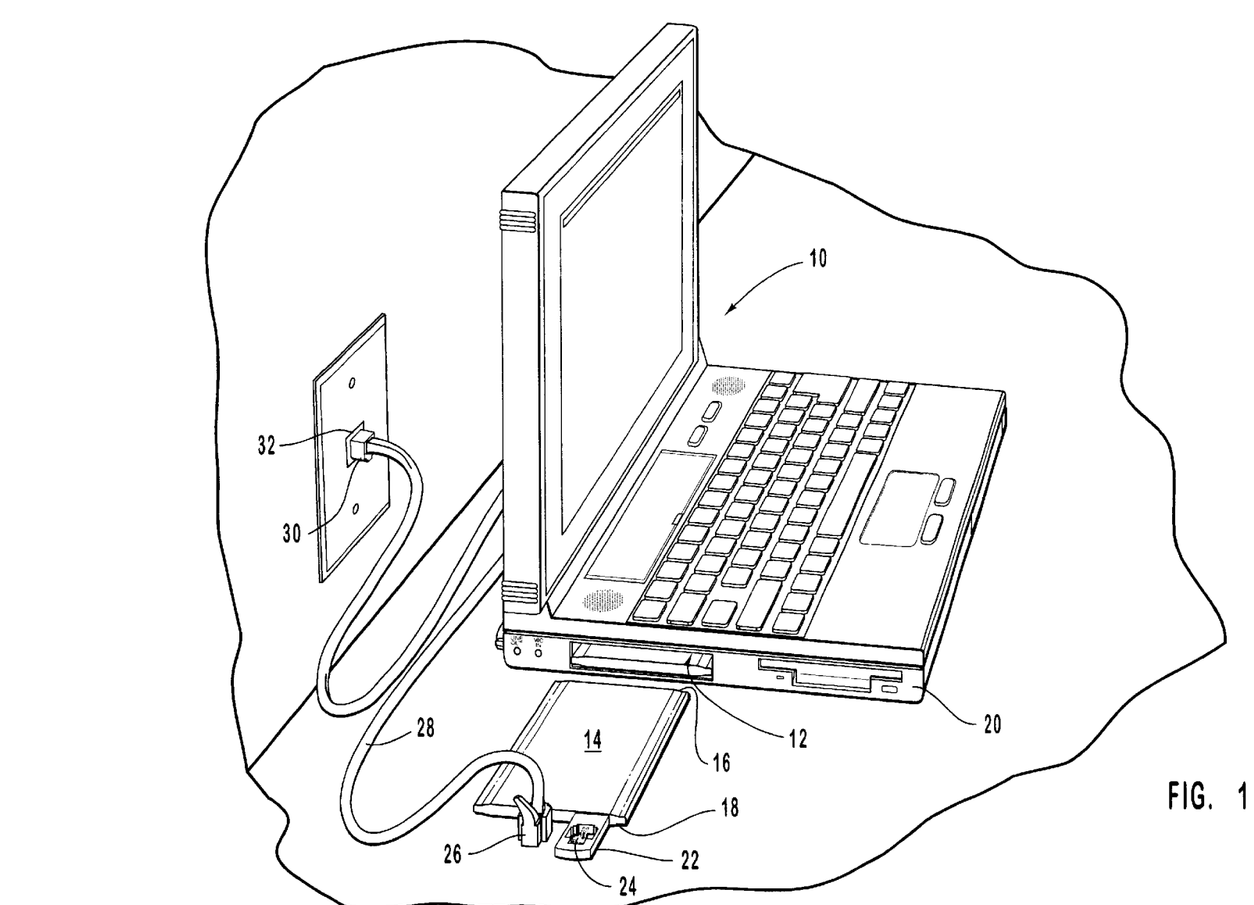
FIG. 1 is a perspective view of a retractable platform with a wireless interface in accordance with a preferred embodiment of the present invention, illustrating the retractable platform in connection with an exemplary expansion card that is insertable into a slot in a portable computer.

As shown in FIG. 1, a portable computer 10 includes an expansion slot 12 that is configured to receive an expansion or communication card 14. The expansion card 14 includes a first end 16 that is configured to be inserted into the slot 12 and a second end 18 that is generally disposed flush with an outer surface 20 of the computer 10 when the card is inserted into the slot. It will be appreciated that the computer 10 can be any suitable type of general or special purpose computer, such as a desktop, portable, notebook, palm, personal data assistant (PDA), and the like.

The communication card 14 is configured to allow communication with systems or networks, such as telephone networks, local area networks (LANs), wide area networks (WANs), wireless networks and the like. The communication card 14 preferably complies with the PCMCIA standards for a PC Card, but the card can be any suitable type of card such as an Advanced Technology Attachment (ATA) card, Compact Flash card, SmartMedia card, Solid State Floppy Disk Card (SSFDC), etc. One skilled in the art will recognize that while the communication card 14 may comply with any suitable standards or guidelines, the card may also have other acceptable designs or characteristics. Further, while the card 14 may facilitate communication with a network or system, the card may be configured to permit communication with any desirable type of device or interface.

In the preferred embodiment shown in FIG. 1, a retractable platform 22 is connected to the second end 18 of the card 14. The retractable platform 22 includes an opening 24 that is sized and configured to removably receive a connector plug 26 that is connected to one end of media cable 28. The opening 24 is preferably sized and shaped to preclude insertion of electrically incompatible connector plugs and to prevent inadvertent attachment of plugs that contain electrical signals that could damage the electronics within the card 14. This feature also precludes insertion of inverted connector plugs 26.

As seen in FIG. 1, the other end of media cable 28 includes a plug 30 that is capable of being inserted into a jack 32. The jack 32 is typically connected to a communication network, such as a telephone network, LAN, WAN, private branch exchange (PBX) system, or any suitable type of computer or communication network. Alternatively, the jack 32 may be connected to a peripheral device, such as a scanner, SCSI hard drive array or the like.

The retractable platform 22 preferably has a configuration and arrangement similar to or the same as the inventions disclosed in U.S. patent application Ser. No. 09/357,017, which was filed on Jul. 19, 1999, and U.S. Pat. Nos. 5,727,972; 5,547,401; 5,338,210; and 5,183,404 which are assigned to the same assignee as the present application and hereby incorporated by reference in their entireties. One skilled in the art, however, will understand that the retractable platform 22 may have other suitable configurations and arrangements. One skilled in the art will also understand the retractable platform 22 may include other types of connections such as multiple pin connectors, 15-pin connectors, RJ-type connectors, dongle type connectors, coaxial cable connectors, etc. Additionally, as discussed above, the retractable platform 22 does not require the use of a connector that allows communication with a communication network or system. In contrast, the retractable platform 22 can be used to provide a wireless interface between any suitable types of electronic devices, such as a cellular telephones, pagers, digital cameras, identification systems, etc.

Figure 2:
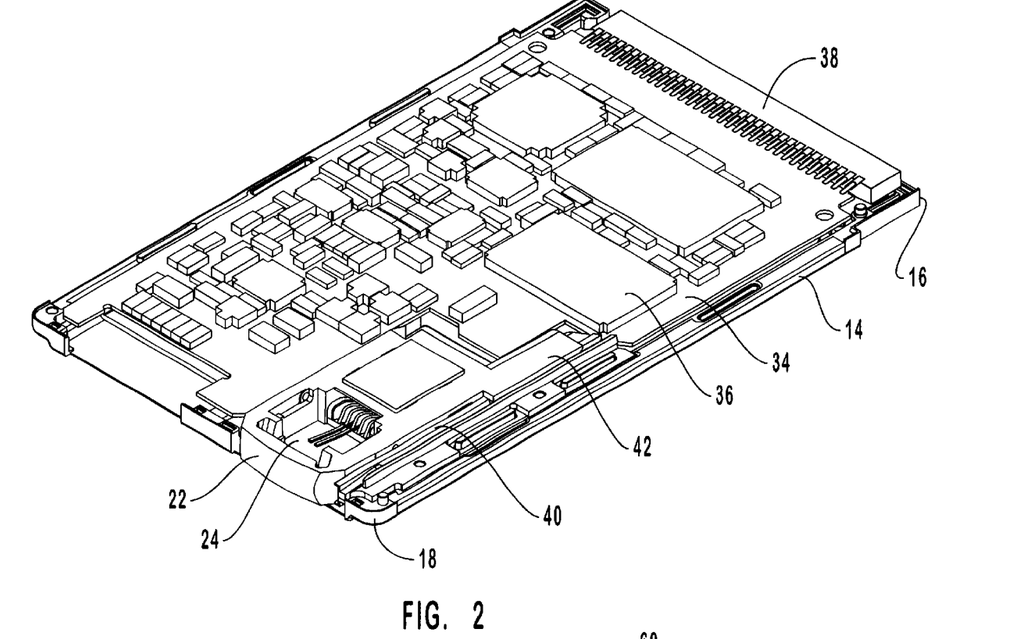
FIG. 2 is a perspective view of the retractable platform and expansion card illustrated in FIG. 1, illustrating the retractable platform in a retracted position and the top cover of the expansion card removed.
Figure 3:
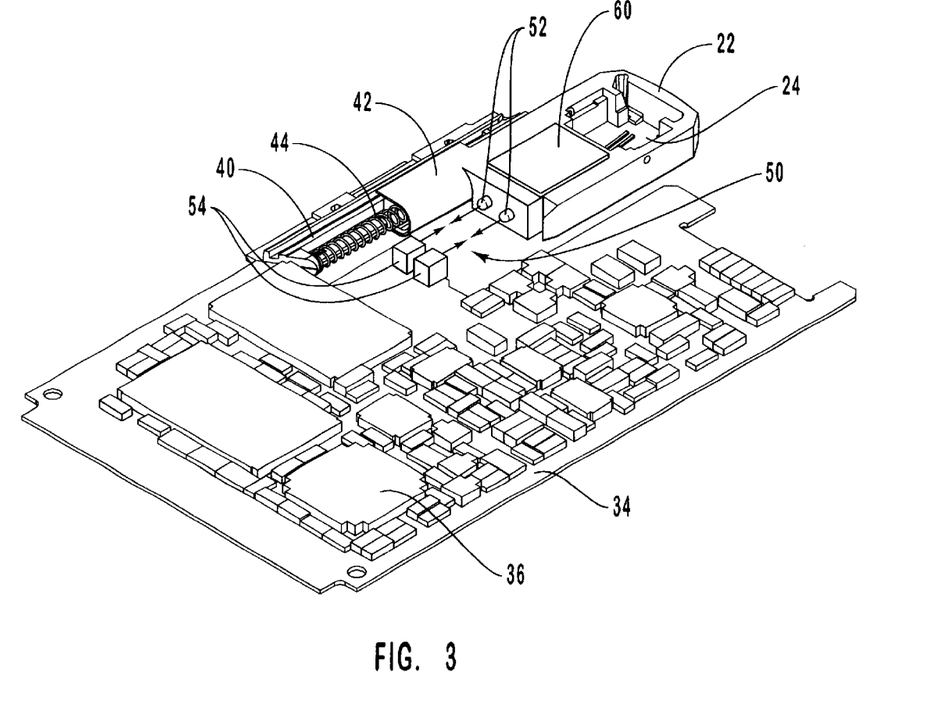
FIG. 3 is a perspective view of another preferred embodiment of the retractable platform, illustrating the retractable platform in an extended position and an optical coupling of the platform and an expansion card.

As seen in FIG. 2, the retractable platform 22 is connected to the communication card 14 and disposed within the communication card is a substrate or printed circuit board (PCB) 34 along with various electronic circuitry and components 36. The circuitry and components 36 are arranged according to the desired functions and capabilities of the communication card 14. The communication card 14 also includes a connector 38 disposed at the front end 16 that is configured to electrically connect the card to the computer 10 and a guide 40 that is used to guide the movement of the retractable platform 22. The guide 40 engages an arm 42 of the retractable platform 22 and it guides the movement of the retractable platform 22 between an extended position and a retracted position. As seen in FIG. 3, a spring 44 may be used to move the retractable platform 22 into the extended position and hold the platform in a retracted position. These structures are described in detail in related application Ser. No. 09/357,017 and U.S. Pat. Nos. 5,727,972; 5,547,401; 5,338,210; and 5,183,404, which were incorporated by reference above.

The retractable platform 22 and the communication card 14 are coupled by a wireless or non-mechanical interface that allows communication between the platform and card. Preferably, there is no physical or mechanical electrical connection between the retractable platform 22 and the communication card 14. In particular, there is preferably no engagement of pins, wires or other structures that electrically connect the retractable platform 22 to the communication card 14. In contrast, as described in greater detail below, a wireless or non-mechanical interface, such as an optical, inductive or capacitive coupling, provides communication between the retractable platform 22 and the communication card 14.

In the preferred embodiment shown in FIG. 3, a light or optical interface 50 provides communication between the retractable platform 22 and the printed circuit board 34 of the communication card 14. The optical interface 50 includes one or more sensors 52 mounted to the retractable platform 24 and one or more sensors 54 attached to a suitable portion of the communication card 14 such as the printed circuit board 34. The sensors 52 and 54 are configured to transmit and/or receive light, such as infrared light (IR), to allow communication between the retractable platform 22 and the communication card 14. Transmission and reception of information, and data and signals via light is well known to those skilled in the art and will not be described in detail herein.

The retractable platform 22 may also include circuitry and/or components 60 disposed within or on any suitable portion of the platform. The circuitry 60, for example, could process or manipulate the incoming and/or outgoing communication signals. Additionally, the circuitry could protect the communication card 14 from damage such as improperly coupling the retractable platform 22 to a digital or PBX communication line. For example, the retractable platform 22 could include a fuse, such as a fuse that satisfies the International Electrochemical Commission (IEC) 2000 fuse requirements, to prevent damage to the expansion card 14 and/or computer 10.

The circuitry 60 could also be used, for example, to comply with suitable safety agency protocols. For instance, the circuitry 60 may be used to satisfy safety standards such as Underwriter Laboratories, Inc. (UL) 1950 relating to the safety of information technology equipment, Canadian Standards Associates (CSA) 22.2 for power supplies, European Committee for Standardization (CEN) EN 60950 for safety of information technology and various standards set forth by the International Electrochemical Commission (IEC). These and other related standards are generally concerned with safety such as electrical shock, mechanical hazards, fires and electrical interference. Advantageously, the circuitry 60 could be designed to comply with all or a portion of these standards.

Figure 4:
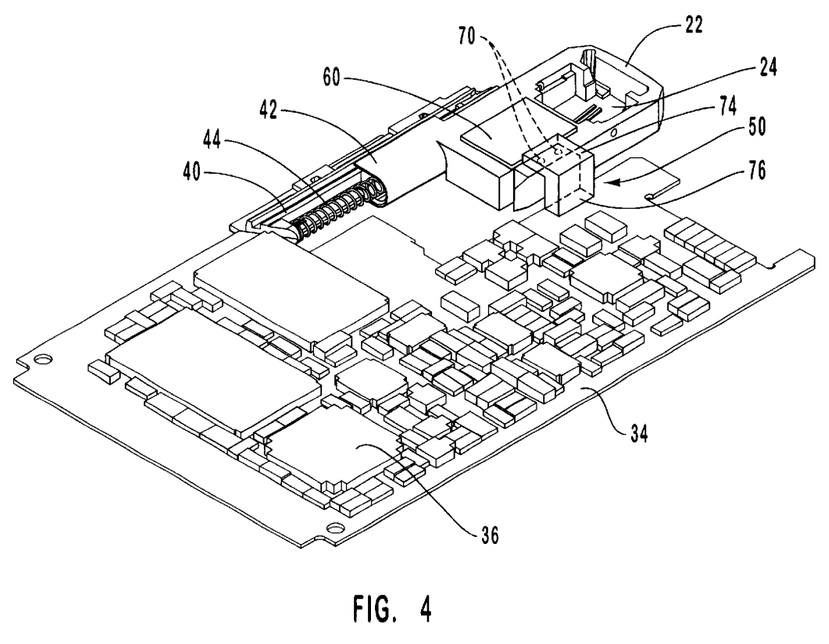
FIG. 4 is a perspective view of still another preferred embodiment of the retractable platform, illustrating the retractable platform in an extended position and an optical coupling of the platform and an expansion card.

FIG. 4 illustrates another preferred embodiment of the retractable platform 22 with a wireless interface. As shown in FIG. 4, the optical interface 50 includes one or more sensors 70 (shown in phantom) mounted to the retractable platform 22 and corresponding sensors (not shown) located in an arm 72. The arm 72 includes a first end 74 that extends over a portion of the body of the retractable platform 22 and a second end 76 that is mounted to the printed circuit board 34. Advantageously, the sensors in the arm 72 are preferably aligned with the sensors 70 on the retractable platform 22 when the platform is in the extended position, as shown in FIG. 4. The sensors in the arm 72 and sensors 70 on the retractable platform 22, however, are not aligned when the platform is in the retracted position. Thus, communication between the retractable platform 22 and the communication card 14 via the optical interface 50 only occurs when the retractable platform is in the extended position and not when the retractable platform is in the retracted position. This prevents inadvertent or unintended communication when the retractable platform 22 is in the retracted position. One skilled in the art will readily appreciate the optical interface 50 could have other various suitable configurations and arrangements.

Figure 5:
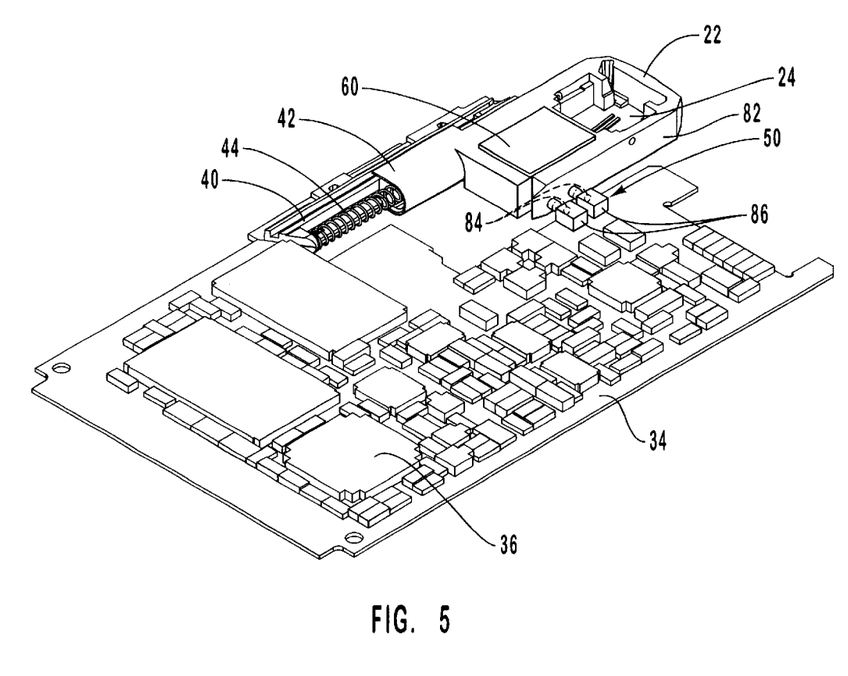
FIG. 5 is a perspective view of yet another preferred embodiment of the retractable platform, illustrating the retractable platform in an extended position and an optical coupling of the platform and an extension card.

FIG. 5 illustrates another preferred embodiment of the retractable platform 22 including an optical interface 50 with one or more sensors 80 attached to a side 82 of the retractable platform. One or more corresponding sensors 84 (shown in phantom) are mounted in housings 86 that are attached to the printed circuit board 34. The housings 86 are preferably located such that the sensors 84 are aligned with the sensors 80 to facilitate communication when the retractable platform 22 is in the extended position, but not when the retractable platform is in the retracted position. As discussed above, this allows communication via the optical interface 50 only when the platform 22 is extended and not when it is retracted. Advantageously, this saves power and allows for the more efficient use of resources within the communication card 10. Additionally, the power needed to transmit the signals between the sensors 80 and 84 is minimized because the sensors are positioned proximate to each other. Further, the optical interface 50 requires a very small amount of valuable space on the printed circuit board 34 and a very small amount of space within the communication card 10. Thus, the optical interface 50 can be used with communication cards 10 and other types of electronic devices of various sizes and configurations. Finally, the close proximity of the sensors 80 and 84 minimizes signal interference.

Figure 6:
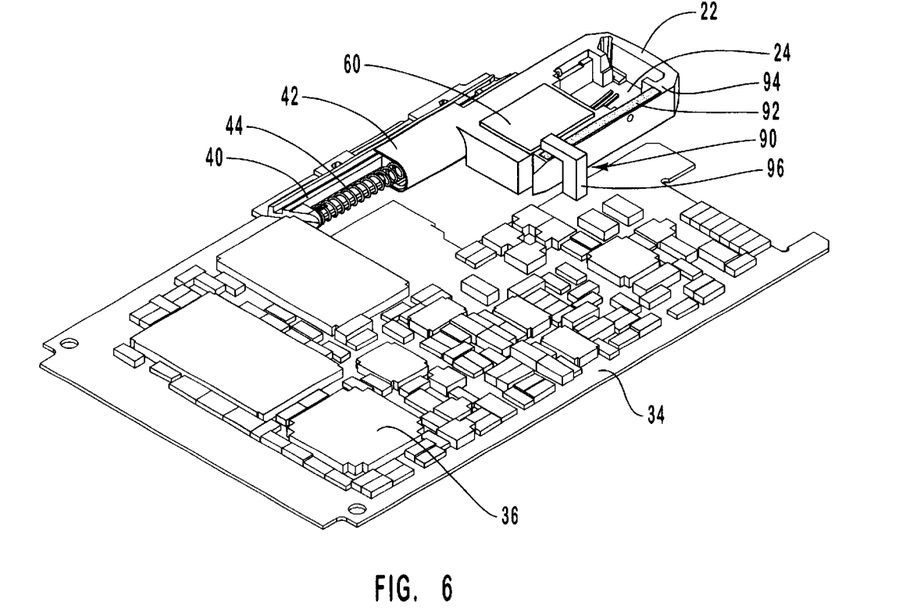
FIG. 6 is a perspective view of a further preferred embodiment of the retractable platform, illustrating an inductive coupling of the platform and an expansion card.

As seen in FIG. 6, another preferred embodiment of the retractable platform 22 includes an inductive coupling 90 of the platform to the printed circuit board 34 of the communication card 14. The inductive coupling 90 includes an inductive strip 92 positioned along an upper surface 94 of the retractable platform 24 and a receiver arm 96 attached to the printed circuit board 34. Thus, in this preferred embodiment, signals are transmitted between the retractable platform 22 and the communication card 14 through the inductive strip 92 and receiver arm 96 of the inductive coupling 90. One skilled in the art understands that signals can be transmitted and received by the inductive coupling 90 and that allows the retractable platform 22 to communicate with the card 14. It will be appreciated that the inductive coupling 90 may have other desired configurations and arrangements, such as various types of conductive surfaces and receiving members.

Figures 7, 8:
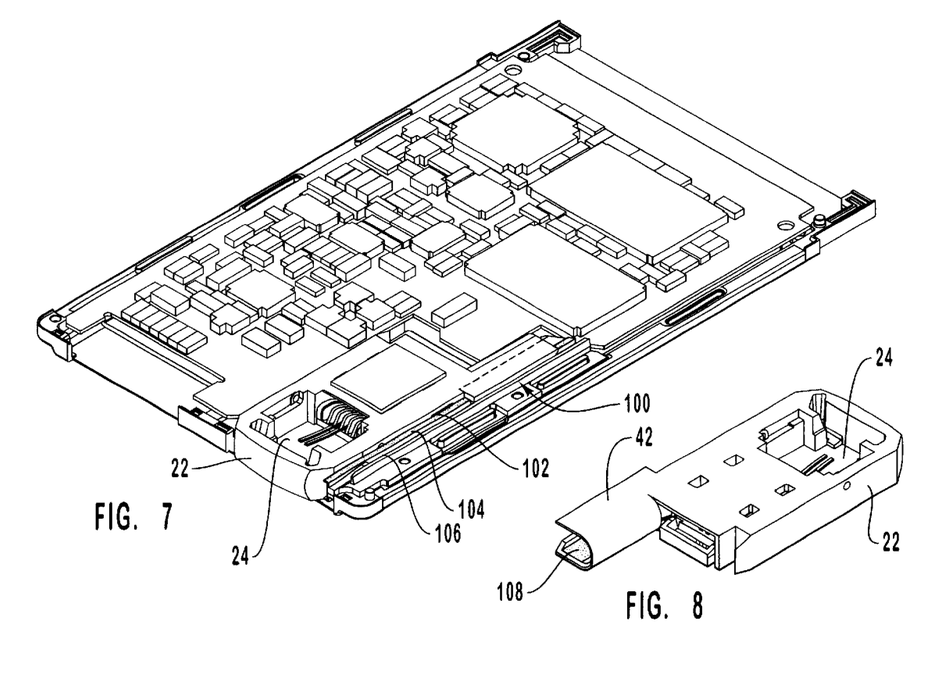
FIG. 7 is a perspective view of another preferred embodiment of the retractable platform, illustrating the retractable platform in a retracted position and a capacitive coupling of the platform and an expansion card.
FIG. 8 is an enlarged perspective view of the retractable platform shown in FIG. 7.

FIGS. 7 and 8 illustrate another preferred embodiment of the retractable platform 22 with a capacitive coupling 100 that allows communication between the platform and the communication card 14. The capacitive coupling 100 includes a capacitive strip 102 located along an edge 104 of the guide 106 that guides the extension and retraction of the platform 22. The capacitive coupling 100 also includes a capacitive strip 108 located on the retractable platform 24. Preferably, the capacitive strip 108 is disposed within the arm 42 of the retractable platform 22, but the capacitive strip could be located in any suitable location. The conductive strips 102 and 108 are positioned proximate to each other to allow signals and other information to be transmitted and received between the retractable platform 24 and the communication card 10. Advantageously, the capacitive coupling 100 allows bi-directional communication between the retractable platform 24 and the communication card 14. It will be appreciated that the conductive coupling 100 may have other suitable arrangements and characteristics depending, for example, upon the type of communication card 14 or electrical device. Thus, the capacitive coupling 100 creates a non-mechanical interface between the retractable platform 22 and the communication card 14. One skilled in the art will also recognize that other types of wireless interfaces, such as a conductive coupling or field effects, may also be used to allow communication between the retractable platform and an electronic device such as a communication card.

Although this invention has been described in terms of certain preferred embodiments, which should be considered only as illustrative and not restrictive, other embodiments apparent to those of ordinary skill in the art are also within the scope of this invention. Accordingly, the scope of the invention is intended to be defined only by the following claims rather than by the foregoing description. All changes that come within the meaning and range of equivalency of the claims are to be embraced within their scope.

What is claimed is:

1. An apparatus comprising:
   a communication card including an upper surface and a lower surface;
   a printed circuit board at least partially disposed between the upper surface and the lower surface of the communication card;
   a retractable platform movably attached to the communication card, the retractable platform movable between a first position and a second position, the retractable platform including circuitry relating to the operation of the communication card; and
   a wireless interface that allows communication between the retractable platform and the communication card.

2. The apparatus of claim 1, wherein the circuitry is configured to process communication signals being transmitted to the communication card.

3. The apparatus of claim 1, wherein the circuitry is configured to protect the communication card from damage.

4. The apparatus of claim 1, wherein the wireless interface only allows communication between the retractable platform and the communication card when the retractable platform is in the first position.

5. The apparatus of claim 1, wherein the wireless interface includes an optical coupling between the retractable platform and the communication card.

6. The apparatus of claim 5, wherein the optical coupling uses IR light to communicate between the retractable platform and the communication card.

7. The apparatus of claim 1, wherein the wireless interface includes an inductive coupling between the retractable platform and the communication card.

8. The apparatus of claim 1, wherein the wireless interface includes a capacitive coupling between the retractable platform and the communication card.

9. The apparatus of claim 1, wherein the retractable platform and the communication card are electrically isolated except for the wireless interface between the retractable platform and the communication card.

10. An apparatus comprising:
    a communication card including an upper surface and a lower surface;
    a printed circuit board at least partially disposed between the upper surface and the lower surface of the communication card;
    a retractable platform movably attached to the communication card, the retractable platform movable between a first position and a second position, the retractable platform including DAA circuitry; and
    a wireless interface that allows communication between the retractable platform and the communication card.

11. A retractable platform that allows communication to be established with an electronic device, the electronic device including a guide that allows the retractable platform to be extended and retracted relative to the electronic device, the retractable platform comprising:
    a main body;
    an arm attached to the main body, the arm being sized and configured to slidably attach the main body to the guide of the electronic device;
    a wireless interface that allows communication between the retractable platform and the electronic device; and
    circuitry disposed on the main body, the circuitry relating to the communication between the retractable platform and the electronic device.

12. The retractable platform of claim 11, wherein the circuitry is configured to process communication signals being transmitted to the electronic device.

13. The retractable platform of claim 11, wherein the circuitry is configured to protect the electronic device from damage.

14. The apparatus of claim 11, wherein the wireless interface only allows communication between the retractable platform and the electronic device.

15. A communication card that permits communication to be established with an external source, the communication card comprising:

a housing;

a printed circuit board disposed within the housing;

a retractable platform that is movable relative to the housing, the retractable platform movable between a first position and a second position, the retractable platform including circuitry relating to the operation of the communication card; and a wireless interface including a first portion attached to the retractable platform and a second portion attached to the printed circuit board, the wireless interface permitting communication to be established between the retractable platform and the printed circuit board.

16. The communication card of claim 15, wherein the wireless interface includes an optical coupling between the retractable platform and the printed circuit board.

17. The communication card of claim 15, wherein the wireless interface includes an inductive coupling between the retractable platform and the printed circuit board.

18. The communication card of claim 15, wherein the wireless interface includes a capacitive coupling between the retractable platform and the printed circuit board.

19. The communication card of claim 15, wherein the retractable platform and the printed circuit board are electrically isolated except for the wireless interface that permits communication to be established between the retractable platform and the printed circuit board.

20. The communications card of claim 15, wherein the wireless interface allows communication between the retractable platform and the communication card only when the retractable platform is in the first position.

21. A communications card for use in communicating with a host device, comprising:

a card housing;

a printed circuit board disposed within the card housing;

a retractable platform movably attached to the printed circuit board, the platform movable between a retracted position and an extended position, the platform including circuitry relating to the operation of the communications card; and a wireless optical interface capable of transmitting information between the platform and the printed circuit board, wherein the optical interface is configured to enable communication between the platform and the printed circuit board when the platform is in the extended position.

22. A communications card as defined in claim 21, wherein the optical interface communicates via infrared radiation.

23. A communications card as defined in claim 21, wherein the retractable platform further comprises an aperture configured to receive a media connector plug.

24. A communications card as defined in claim 21, wherein the circuitry is configured to process communication signals being transmitted to the communications card.

25. A communications card as defined in claim 21, wherein the circuitry is configured to protect the communications card from damage.

26. A communications card as defined in claim 21, wherein the circuitry comprises DAA circuitry.

* * * * *